United States Patent [19]

Hosaka et al.

[11] Patent Number: 4,504,726
[45] Date of Patent: Mar. 12, 1985

[54] PATTERN GENERATOR

[75] Inventors: Sumio Hosaka, Hachioji; Akihiro Takanashi, Kokubunji; Toshiei Kurosaki, Tokyo; Shinji Kuniyoshi, Tokyo; Yoshio Kawamura, Tokyo; Tsuneo Terasawa, Kokubunji, all of Japan

[73] Assignee: Hitachi, Ltd., Tokyo, Japan

[21] Appl. No.: 327,627

[22] Filed: Dec. 4, 1981

[30] Foreign Application Priority Data

Dec. 17, 1980 [JP] Japan ................... 55/177281

[51] Int. Cl.³ .................................. B23K 27/00
[52] U.S. Cl. ...................... 219/121 LH; 219/219; 219/121 LU; 219/121 LW; 219/121 LY
[58] Field of Search ............... 219/121 LH, 121 LJ, 219/121 LU, 121 LW, 121 LY, 121 LP, 121 LD

[56] References Cited

U.S. PATENT DOCUMENTS

| | | | |
|---|---|---|---|
| 3,560,258 | 2/1971 | Brisbane | 219/121 LC X |
| 3,569,993 | 3/1971 | Blin | 219/121 LY X |
| 3,889,272 | 6/1975 | Lov et al. | 219/121 LW X |
| 4,190,759 | 2/1980 | Hongo et al. | 219/121 LW |
| 4,215,694 | 8/1980 | Isakov et al. | 219/121 LY X |
| 4,278,867 | 7/1981 | Tan | 219/121 LD |
| 4,316,073 | 2/1982 | Lemelson | 219/121 LW X |
| 4,328,410 | 5/1982 | Slivinsky et al. | 219/121 LW X |

Primary Examiner—C. L. Albritton
Attorney, Agent, or Firm—Antonelli, Terry & Wands

[57] ABSTRACT

A pattern generator in which a workpiece to be machined into a desired pattern shape is held in vacuum and is irradiated with a laser beam condensed to be fine, while scanning the laser beam so as to depict the desired pattern shape, whereby the workpiece is directly machined in conformity with the desired pattern shape. As the workpiece, one in which a shading film (for example, chromium film) is deposited on a transparent glass substrate is employed, and it is irradiated with the laser beam in the vacuum, whereby the irradiated parts of the shading film are vaporized to fabricate a shading mask pattern of good quality.

5 Claims, 15 Drawing Figures

PATTERN GENERATOR

BACKGROUND OF THE INVENTION

1. Field of the Invention

This invention relates to a pattern generator, and more particularly to improvements in a method of making or trimming a pattern with a pattern generator.

2. Description of the Prior Art

A pattern generator having hitherto been used employs a method in which a shaped pattern is projected on a photosensitive material (photoresist) and in which a large number of such shaped patterns are used to form an enlarged pattern (hereinbelow, called the "reticle pattern" and generally termed the "reticle") which is at least 5 times larger than an IC chip pattern.

FIG. 1 shows a schematic view of the pattern generator having heretofore been used. Light emerges from a light source 1, and a light beam having a specified wavelength is projected onto a photoresist film applied on the surface of a workpiece (reticle substrate) 8, by an optical unit 2 which is composed of a shutter, filter, lens etc. and through a reduction projection lens system 7 which has a reduction ratio of at least 5. That is, an enlarged shaped pattern formed by slit assemblies composed of parts 3, 3' and 4, 4' which are disposed between the optical unit 2 and the reduction projection lens system 7 (for example, in case where a reticle being 10 times larger is fabricated and where a 1/10-reduction projection lens is used, the enlarged shaped pattern is 100 times larger than the actual size) is reduced and projected to form a resist latent image pattern. In order to obtain a desired enlarged shaped pattern, gears 5 and 6 are driven with control signals delivered from a data processing system (not shown), to widen or narrow the interspaces of the slit assemblies 3, 3' and 4,4' and thus control the size of a slit opening. Further, an X-direction stage 11 and a Y-direction stage 12 which hold the recticle substrate 8 are controlled by the data processing system, to relatively move the enlarged shaped pattern to a desired position on the recticle substrate 8, whereupon the reduced image of the enlarged shaped pattern is made. In such way, resist latent image patterns in any desired arrayal are formed. In the figure, numeral 13 indiates a base, and numerals 14 and 15 indicate motors for driving the X-direction stage and Y-direction stage, respectively.

As explained above, the reticle fabrication by the prior-art apparatus adopts wholly the mechanical drive system such as the mechanical drive of the slit assemblies for controlling the size of the enlarged shaped pattern and the mechanical drive of the stages for controlling the arrayal of the enlarged shaped patterns. Therefore, it poses problems in points of the fabrication time and the fabrication precision. Especially as to the fabrication time, it is the present situation that a long period of time of about 10 hours is required for fabricating an ordinary LSI pattern.

On the other hand, since the reticle pattern formed by the prior-art pattern generator illustrated in FIG. 1 is the resist latent image pattern, processing steps such as the formation (developing) of a resist pattern and the etching of a shading material are further required after the exposure. FIGS. 2a–2i constitute a flow chart showing an example of a process for fabricating the reticle pattern. First, as shown in FIG. 2a, using a thermal beam 16, a sample (reticle substrate) 8 in which a shading material 9 is deposited on a transparent glass substrate 10 is subjected to baking prior to coating with a resist. Subsequently, as shown in FIG. 2b, whilst rotating the sample 8, the resist material is dropt thereonto so as to form a uniform resist film 17 on the shading material 9. Thereafter, as shown in FIG. 2c, the sample 8 is prebaked with the thermal beam 16 again. Thereafter, upon confirming that the temperature of the sample has lowered to the room temperature, the resist latent image 18 of a desired pattern is formed as shown in FIG. 2d by the use of the pattern generator explained with reference to FIG. 1. Subsequently, as shown in FIG. 2e, the resist latent image pattern formed by the pattern generator is treated with a resist developer 19, thereby to develop the resist pattern 17. Thereafter, the developed pattern is fixed with a rinse, and the resultant sample is post-baked with the thermal beam 16 as shown in FIG. 2f. Subsequently, as shown in FIG. 2g, using the resist pattern 17 as a mask, the shading material 9 is chemically etched with an etchant 20 so as to form the pattern of the shading material 9. After the etching, the sample is washed with water, and the resist pattern 17 is removed with a resist stripper 21 as shown in FIG. 2h. Lastly, the resultant sample is washed with water and dried. Then, the fabrication of the reticle made up of the shading material pattern 9 and the glass substrate 10 as shown in FIG. 2i is finished.

As described above, the prior-art process has the disadvantage that large numbers of thermal treatment and chemical treatment steps are necessitated. In particular, the reticle fabricating steps other than the foregoing step of forming the resist latent image pattern take a long period of wasteful time. As the period of time for the series of thermal and chemical treatments, at least 2 hours are required. Along with shortening of the period of time for the formation of the resist latent image pattern itself, improvements in or omission of such attendant processing steps have/has become an important subject.

SUMMARY OF THE INVENTION

It is accordingly an object of this invention to eliminate the disadvantages of the prior art as stated above, and more specifically, to provide a pattern generator which makes it possible to fabricate a pattern of high precision in a short time without employing a resist material.

In order to accomplish the object, this invention has taken note of laser machining and consists in that a shading material such as chromium (Cr) is directly patterned by the use of the laser machining. Further, this invention consists in that as will be described in detail, a workpiece is placed in vacuum and is directly irradiated with a laser beam, thereby to pattern the shading material.

The other objects and features of this invention and functional effects attained thereby will become self-explanatory from the following detailed description taken in conjunction with embodiments.

DESCRIPTION OF THE PREFERRED EMBODIMENTS

Hereunder, in describing this invention in detail, the principle of the invention will be briefly explained.

The conventional laser machining is carried out in the atmosphere. This has led to such problems that the edge of a pattern machined bulges into a lip, that a substrate and a workpiece (shading material) fuse together, and that the substrate is damaged. These result from the dissolution of the workpiece, and are ascribable to the influence of a surface tension, the chemical reaction of the material with oxygen in the atmosphere, etc. In order to eliminate the aforecited disadvantages of the laser machining, therefore, the following are required: (1) to reduce the thermal diffusion and thermal conduction of the workpiece (shading material), (2) to make the melting point and boiling point of the workpiece close to the utmost, and desirably, to consider the selection etc. of a material whose boiling point is lower than its melting point, in other words, which causes sublimation, and (3) to reduce oxidation during the laser machining.

To these ends, this invention has adopted a method wherein at least the workpiece (shading material) is set in vacuum and wherein the laser machining is performed within the vacuum, thereby to directly form an IC pattern etc. at high precision and at high speed. The shading material fulfilling the above requisites is, for example, chromium (Cr) which causes sublimation at a degree of vacuum on the order of $10^{-2}$ Torr. Especially, a mask plate which employs chromium as the workpiece (shading material) is effective for making a resist pattern. Of course, any other material meeting the requisites is applicable to this invention.

Now, this invention will be described in detail in connection with embodiments.

Figure 1:
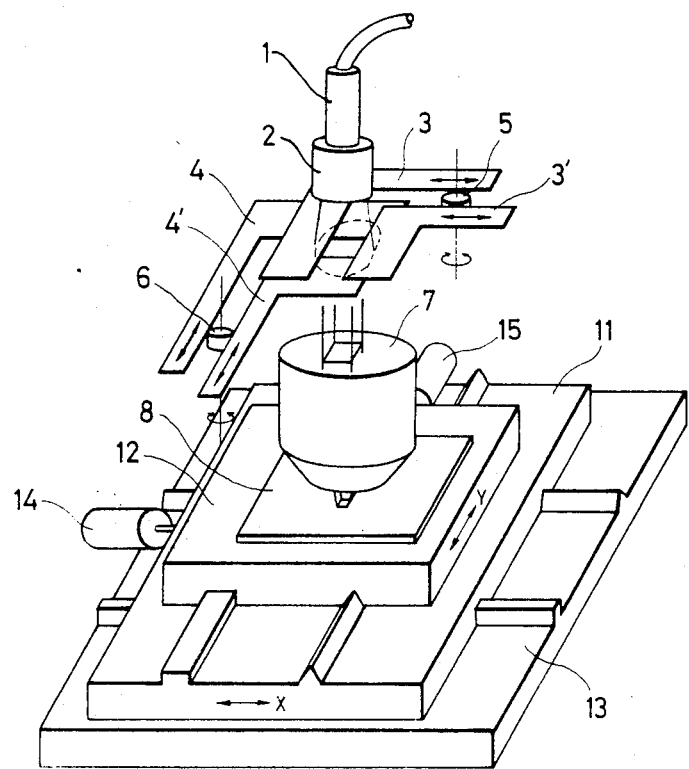
FIG. 1 is a view showing the schematic construction of a prior-art pattern generator, FIGS. 2a–2i constitute a flow chart for explaining an example of a process for fabricating a reticle pattern with the prior-art pattern generator.
Figure 2A:
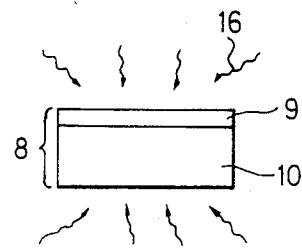
Figure 2B:
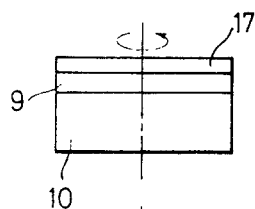
Figure 2C:
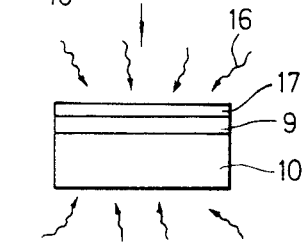
Figure 2D:
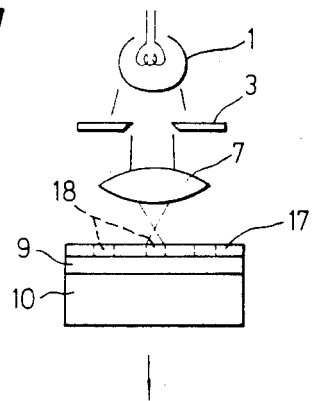
Figure 2E:
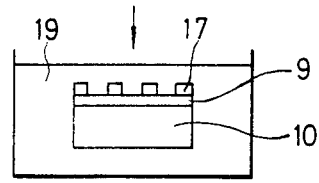
Figure 2F:
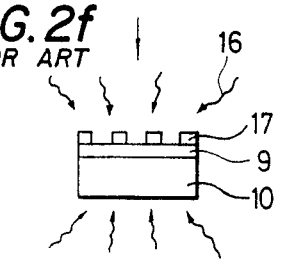
Figure 2G:
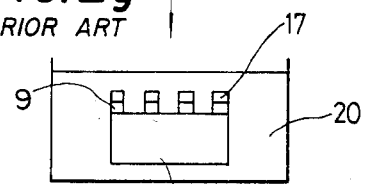
Figure 2H:
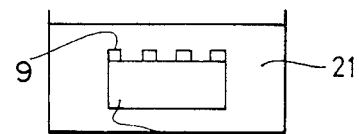
Figure 2I:
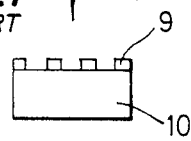
Figure 3:
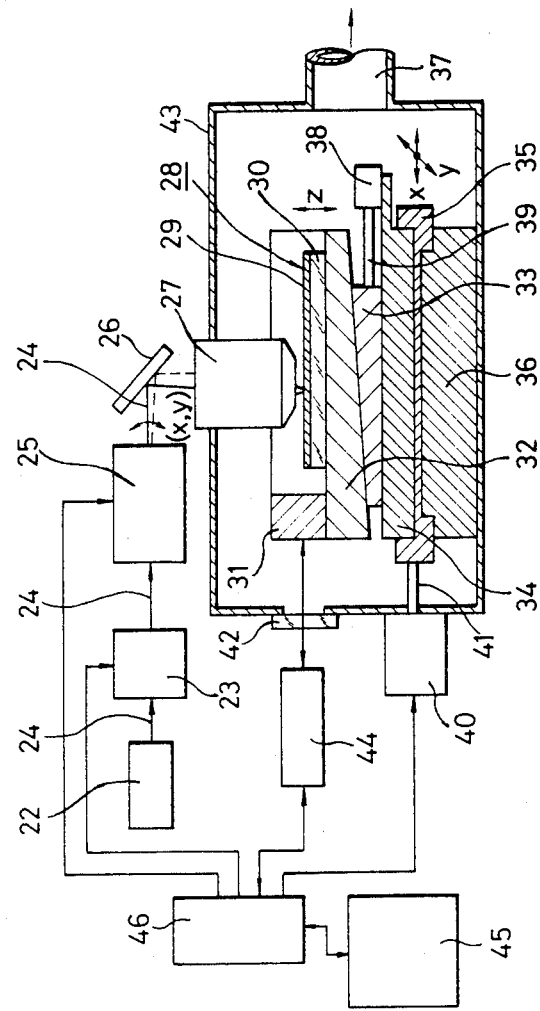
FIG. 3 is a view showing the schematic construction of a pattern generator embodying this invention.

FIG. 3 is a schematic view showing an embodiment of this invention. Referring to the figure, a laser beam 24 emitted from a high power laser source 22 enters a laser beam deflector 25 via a laser beam modulator 23, and it is deflected in at least one of x and y directions. After the deflection, the laser beam 24 is turned by a mirror 26 and is focused by a focusing lens 27 onto a film to-be-machined 29 formed on the upper surface of a transparent glass substrate 30 in a sample 28. Thus, the direct machining of the film to-be-machined 29 is performed.

The laser source 22 employed here signifies a continuous-wave laser source such as argon ion laser or a pulse laser source such as excimer laser. As the laser beam modulator 23, there is employed an acoustooptical device, an electrooptical device, a mechanical modulator or the like. When the pulse laser source is used, the laser beam modulator may be sometimes omitted. Used as the laser beam deflector 25 is a mechanical one employing a polygon mirror or galvanometer, or one employing a acoustooptical device or the like. It deflects the laser beam in at least one axial direction.

In such direct machining, the laser beam 24 is fined into a very small spot diameter, and hence, the focal depth becomes small. The apparatus is therefore controlled so that the focusing position may be held fixed by means of a Z-direction moving mechanism for a movable stage installed in vacuum. Although a detection mechanism for the Z-direction position of the film to-be-machined 29 is not illustrated in the figure, this position is detected by a known, pattern dimension measuring method employing a laser beam or the like method, and the spacing between the focusing lens 27 and the film to-be-machined 29 is held constant by the Z-direction moving mechanism, to be described later, which responds to the resulting detection signal.

The whole movable stage to place the sample 28 thereon has a structure wherein an X-direction stage 35 and a Y-direction stage 34 are carried on a stationary base 36 and wherein a sample holder 32 carrying a mirror for laser measurement 31 is stacked on the Y-direction stage 34 through a wedge for Z-direction movement 33, the holder 32 being movable in X-, Y- and Z-directions. The Z-direction drive is executed by moving the wedge 33 horizontally and driving the holder 32 in the Z-direction (along the optic axis) by means of a Z-direction driving motor 38 and feed screw 39. The X-direction stage 35 is driven by an X-direction driving motor 40 and through an X-direction feed screw 41, and it is positioned to a destination address or continuously moved at a constant speed in the X-direction. Although not illustrated in the figure, the drive of the Y-direction stage 34 is similarly performed. The position of the holder 32 in the X-direction is detected by a laser measurement equipment 44. This laser measurement equipment 44 may be, for example, one utilizing a known laser interferometer or a conventional length measuring instrument based on the moire method. Although not illustrated in the figure, the positional detection in the Y-direction is performed similarly to the above. The Z-direction movement can be made, not only by the system employing the wedge 33 shown in the present embodiment, but also by means employing a piezoelectric device or by an electromagnetic driver such as voice coil. Further, the whole movable stage is installed within a vacuum chamber 43, the interior of which is evacuated through an evacuating port 37. Numeral 42 designates a viewing port for laser measurement. The sample 28 is such that the film to-be-machined 29 made of chromium or the like is deposited on the transparent glass substrate 30. This sample is installed on the holder 32.

In order to systematically operate the devices described above, the control system of the present pattern generator is chiefly composed of a computer 45, a data processor 46 and the laser measurement equipment 44. In forming an IC pattern, in order to permit the raster scanning attended with the continuous drive of the movable stage and the random access scanning and raster scanning based on the step-and-repeat of the movable stage, the laser beam modulator 23, laser beam deflector 25, stage driving motor 40 (only the X-direction driving motor is shown in the figure) and laser measurement equipment 44 are controlled by the computer 45 and data processor 46 so as to directly machine the desired IC pattern on the film 29 with the laser.

Figure 4A:
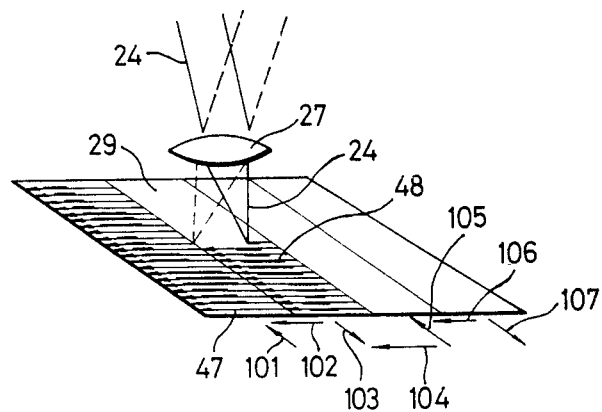
FIG. 4A is a view for explaining an example of a method of forming a pattern with the pattern generator according to this invention.
Figure 4B:
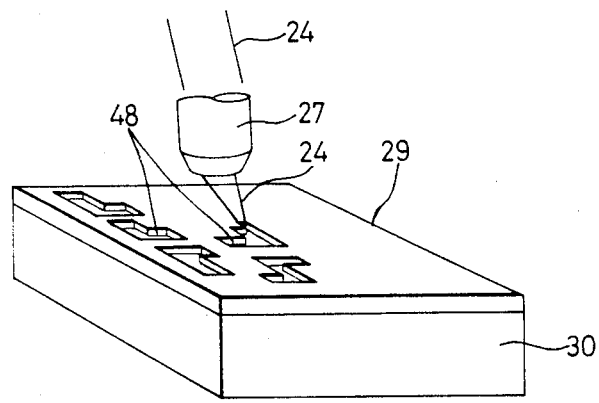
FIG. 4B is a model view for explaining the aspect of the pattern formation by the method illustrated in FIG. 4A.

By way of example, FIGS. 4A and 4B elucidate a pattern making method based on the raster scanning attended with the continuous drive of the movable stage. As shown in FIG. 4A, the laser beam 24 is scanned in the direction of arrows 47 within a specified range of the surface of the film to-be-machined 29, to successively and continuously move in directions 101, 102, 103, 104, 105, 106 and 107 and to directly machine the desired laser-machining range of the sample 28. At this time, in order to make a pattern 48 in a desired shape, data from the computer 45 are processed by the data processor 46, and the laser beam modulator 23 is turned "on" and "off" in synchronism with the deflected position of the laser beam and the moved position of the holder, whereby only a part corresponding to the desired pattern is irradiated with the laser beam. By synchronously controlling the deflection of the laser beam, the modulation of the laser beam and the drive of the movable stage as described above, it becomes possible to directly machine the film to-be-machined (shading film) 29 on the glass substrate 30 into the desired pattern shape as illustrated in FIG. 4B.

The embodiment stated above is so constructed that the sample and the whole movable sample stage to place the sample thereon are installed within the vacuum vessel. In this invention, however, the whole movable stage need not always by put in vacuum, but it suffices for the direct machining with the laser beam that at least the workpiece is situated in vacuum.

Figure 5:
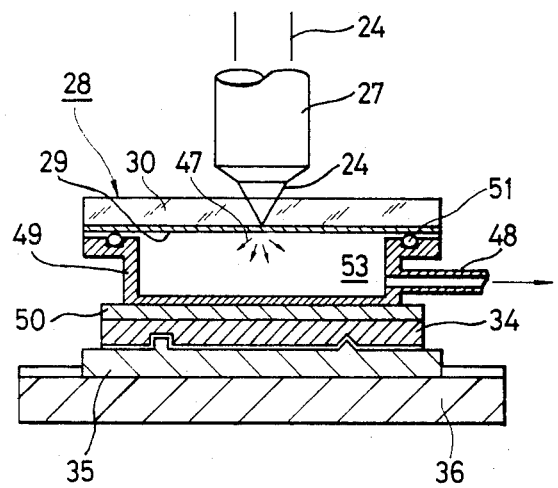
FIG. 5 is a view showing the schematic construction of a part of a pattern generator according to another embodiment of this invention.

FIG. 5 is a schematic view showing an embodiment for such aspect of performance. It is sufficient for the laser machining of this invention that at least the workpiece lies in vacuum, and not only the construction shown in FIG. 3, but also a construction shown in FIG. 5 can be employed. In the embodiment of FIG. 5, a vacuum vessel 49 having an evacuating pipe 48 is mounted on X-, Y- and Z-direction stages (35, 34 and 50) disposed on the stationary base 36, the sample 28 is installed so that the film to-be-machined 29 made of the shading material such as chromium may face the side of the vacuum chamber 53 of the vacuum vessel, and the film 29 is directly machined with the laser beam having penetrated through the glass substrate 30. The vacuum vessel 49 has a shielding member, such as an O-ring, 51 interposed between it and the sample 28 itself. Thus, it shields the interior 53 from the atmosphere and holds it in a vacuum state. In this way, the laser beam 24 is permitted to fall on the film to-be-machined 29 held in the vacuum chamber, through the glass substrate 30 and to machine the film. Owing to such construction, the vapor 47 of molecules or atoms emitted from the film to-be-machined 29 during the laser machining is evaporated on the inner wall of the vessel 49. This brings forth the additional effect that the focusing lens 27 can be prevented from being contaminated with the vaporized substance.

Figure 6:
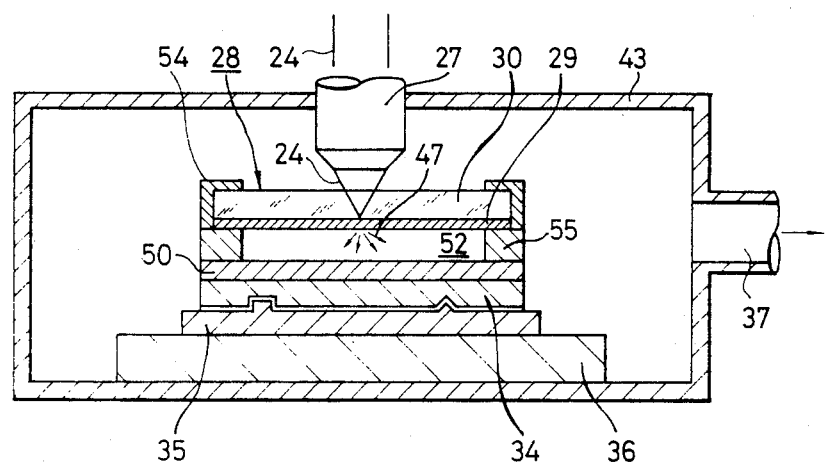
FIG. 6 is a view showing the scheme of the partial construction of a pattern generator according to still another embodiment of this invention.

FIG. 6 is a schematic view showing still another embodiment of this invention. Referring to the figure, a sample table 55 having a hollow space 52 is mounted on the X-, Y- and Z-direction stages (35, 34 and 50). The sample 28 is installed on the table 55 so that the film to-be-machined 29 may face the side opposite to the focusing lens 27 as in FIG. 5. The sample 28 is fixed onto the sample table 55 by a sample holder 54. The film 29 is directly machined with the laser beam having penetrated through the glass substrate 30. Likewise to the embodiment of FIG. 5, accordingly, the embodiment of FIG. 6 can protect the focusing lens 27 against the contamination with the vaporized substance 47 from the film to-be-machined 29. As the sample fixing and holding mechanism in FIG. 6, not only the mechanical means as illustrated, but also an electrostatic chuck mechanism which exploits the conductivity of such metal as chromium constituting the film to-be-machined 29, etc. can of course be used.

Although the stage driving system, the laser measurement system, the control system etc. have been omitted from the description of the embodiments shown in FIGS. 5 and 6, it is needless to say that the same arrangements as explained in the embodiment shown in FIG. 3 can be applied thereto. Any of the foregoing embodiments has been exemplified as employing the so-called lateral laser optical system which runs parallel to the horizon and in which the laser beam is bent by the mirror. Needless to say, however, this invention is not restricted thereto, but the so-called vertical laser optical system which runs at right angles to the horizon is applicable without any hindrance.

As set forth above, according to this invention, a laser beam can be deflected at high resolution and at high speed. It is therefore permitted to prepare a complicated pattern such as IC pattern at higher precision and at higher speed than in the prior-art pattern generator. Further, owing to the direct laser machining, there can be omitted the step of developing a resist, the step of etching a shading metal film, etc. involved in the prior art, and the fabrication time of the IC pattern can be sharply shortened.

Since the laser machining is performed in vacuum, the oxidation of a film to-be-machined is suppressed; the thermal diffusion is reduced, and the boiling point and melting point of the film become close or are inverted in the relation of magnitude, resulting in causing sublimation. Thus, the shape of the machined pattern is improved, and the machining speed of the pattern by the laser beam is increased by the lowering of the vaporizing temperature.

In the case of applying this invention to, for example, the fabrication of a reticle pattern, the pattern of a complicated IC can be directly machined in the same short time as in the case of employing an electron-beam lithographic system. This renders the fabrication of the IC pattern much higher in speed because all thermal and chemical treatments required in the electron-beam lithography can be excluded. Further, when the reticle fabricating technique of this invention is combined with the reduction projection and exposure technique, the processing of an IC pattern till the printing thereof on a wafer can be executed in a very short time on the basis of the data of the pattern. Accordingly, this invention can be effectively utilized for the development of semiconductor devices and for the multikind and small quantity production.

We claim:

1. A pattern generator comprising a laser source, means to modulate a laser beam emitted from said laser source and to deflect it in a desired direction, means to focus the laser beam and to project it onto a workpiece to subject the workpiece to machining by the laser beam, a sample stage on which the workpiece is placed, means for moving the sample stage in three dimensions with the workpiece placed thereon, means to arrange at least the workpiece in vacuum, and means to control scanning of the laser beam in order to form a predetermined pattern on the workpiece, the predetermined pattern being directly formed in a surface of the workpiece in the vacuum by the laser beam machining.

2. A pattern generator according to claim 1, wherein the workpiece is so constructed that a shading material is deposited on a glass substrate.

3. A pattern generator according to claim 2, wherein the shading material is so disposed as to be directly subjected to the machining by the laser beam from the projection means.

4. A pattern generator according to claim 2, wherein the shading material is so disposed as to be subjected to the machining by the laser beam from the projection means, through the glass substrate.

5. A pattern generator according to claim 2, wherein the shading material deposited on the glass substrate is chromium.

* * * * *